United States Patent
Hopfgartner et al.

(10) Patent No.: US 9,218,756 B2
(45) Date of Patent: Dec. 22, 2015

(54) TEST SYSTEM FOR SEMICONDUCTOR ARRAY

(71) Applicant: Infineon Technologies AG, Neubiberg (DE)

(72) Inventors: Herbert Hopfgartner, Lieserbruecke (AT); Alexander Mayer, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 343 days.

(21) Appl. No.: 13/935,952

(22) Filed: Jul. 5, 2013

(65) Prior Publication Data

US 2015/0008964 A1 Jan. 8, 2015

(51) Int. Cl.
*G01R 31/3187* (2006.01)
*G09G 3/00* (2006.01)
*G01R 31/319* (2006.01)

(52) U.S. Cl.
CPC .......... *G09G 3/006* (2013.01); *G01R 31/31924* (2013.01)

(58) Field of Classification Search
None
See application file for complete search history.

(56) References Cited

U.S. PATENT DOCUMENTS 7,586,788 B2 * 9/2009 Mawatari et al. .......... 365/185.2
7,816,907 B2 * 10/2010 Schwarzer et al. ........ 324/750.3

* cited by examiner

*Primary Examiner* — Minh N Tang
(74) *Attorney, Agent, or Firm* — Slater & Matsil, L.L.P.

(57) ABSTRACT

In accordance with an embodiment, an integrated circuit includes a plurality of devices on the integrated circuit. Each device includes a driving circuit, an individual contact pad coupled to a first terminal of the driving circuit, and a switch having a first terminal coupled to the first terminal of the driving circuit. Also, the integrated circuit includes a shared contact pad coupled to a second terminal of each switch of the plurality of devices. The integrated circuit also includes a controller coupled to each switch of the plurality of devices, where the controller is configured to selectively control each switch to couple each driving circuit to the shared contact pad.

20 Claims, 13 Drawing Sheets

TEST SYSTEM FOR SEMICONDUCTOR ARRAY

TECHNICAL FIELD

The present invention relates generally to the field of semiconductor devices, and in particular for the testing of a semiconductor device array.

BACKGROUND

In the field of semiconductor devices, large arrays of many semiconductor devices are increasingly used. For example, large arrays of LED pixels are used for lighting or display purposes. LED arrays are useful because of low energy consumption, high reliability, long lifetime, small size, and fast switching speeds. A large array of LED pixels may be controlled by a large array of semiconductor devices, such as driving circuits implemented using current sources and/or power switches.

Testing semiconductor devices is important to ensure their reliability. However, large arrays of semiconductor devices pose some testing issues. Some industries, such as the automotive industry and aerospace industry, have significant testing requirements to ensure reliability and safety. In order to obtain good test coverage, automated test equipment (ATE) systems have become widespread for testing semiconductor devices. Such ATE systems allow testing to be performed quickly and reduce human involvement in the testing, thereby reducing test cost and human error. An ATE system often involves software that controls hardware to perform tests, collect data, and create reports on the operation of the semiconductor devices.

Front end testing for a large array of semiconductor devices can be problematic because of the high number of contacts corresponding to a large number of devices. Back end testing can be problematic because of the high production costs from failed devices that are not discovered until late in production.

SUMMARY OF THE INVENTION

In accordance with an embodiment, an integrated circuit includes a plurality of devices. Each device includes a driving circuit, an individual contact pad coupled to a first terminal of the driving circuit, and a switch having a first terminal coupled to the first terminal of the driving circuit. Also, the integrated circuit includes a shared contact pad coupled to a second terminal of each switch of the plurality of devices. The integrated circuit also includes a controller coupled to each switch of the plurality of devices, where the controller is configured to selectively control each switch to couple each driving circuit to the shared contact pad.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the testing of a semiconductor device array. The invention may also be applied, however, to other types of circuits, systems, and methods, such as other testing circuits, systems, and methods.

Figure 1:
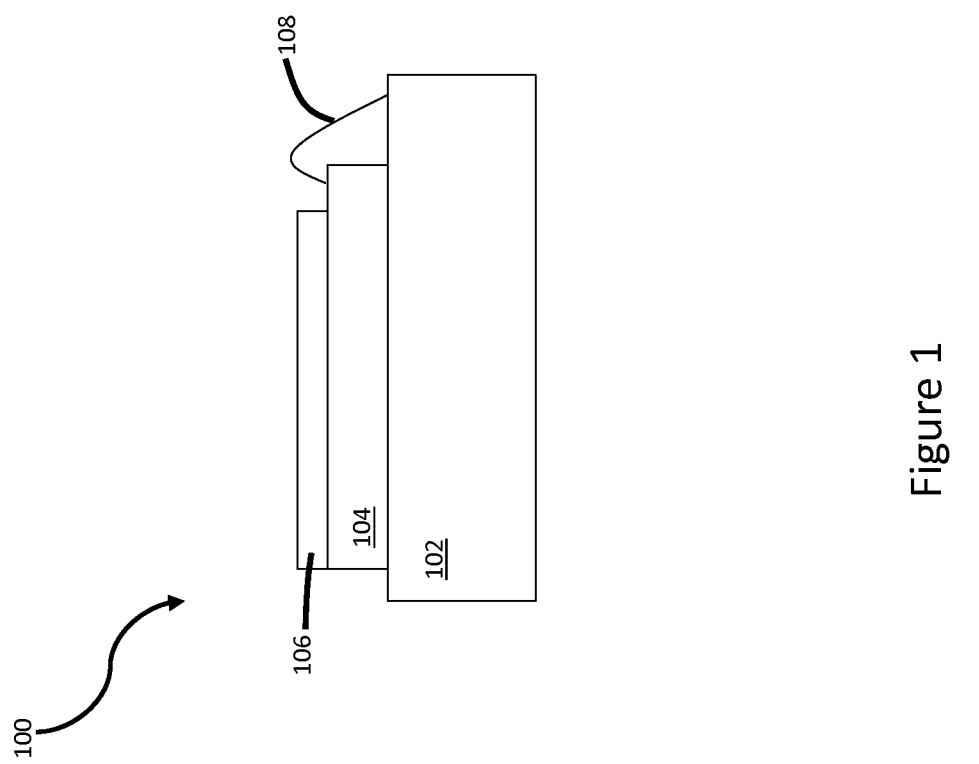
FIG. 1 illustrates an embodiment chip assembly.

Large arrays of semiconductor devices have a variety of applications. For example, a large array of LED pixels might be used for displays and lighting. FIG. 1 illustrates an embodiment chip assembly 100 for a lighting circuit. LED array 106 is mounted on semiconductor device array 104. Many pixels may be disposed on LED array 106. For example, LED array 106 may contain from about 500 LED pixels to about 10,000 LED pixels. However, LED array 106 may contain fewer than 500 LED pixels or more than 10,000 LED pixels. The LED pixels of semiconductor device array 104 may be independently controlled, for example, by coupling a separate semiconductor device to the LED pixels. The semiconductor devices may be driving circuits. In one example, semiconductor device array 104 is an array of current sources. In another example, semiconductor device array 104 is an array of switches, for example an array of power switches. The driving circuits on semiconductor device array 104 have pads that correspond to contact pads of LED pixels on LED array 106. Semiconductor device array 104 may be mounted on PCB 102 so that the contact pad corresponding to the driving circuits are coupled to the contact pads for the corresponding LED pixels. Hence, the driving circuits are coupled to the corresponding LED pixels. Bond wire 108 couples semiconductor device array 104 and PCB 102.

Figure 2:
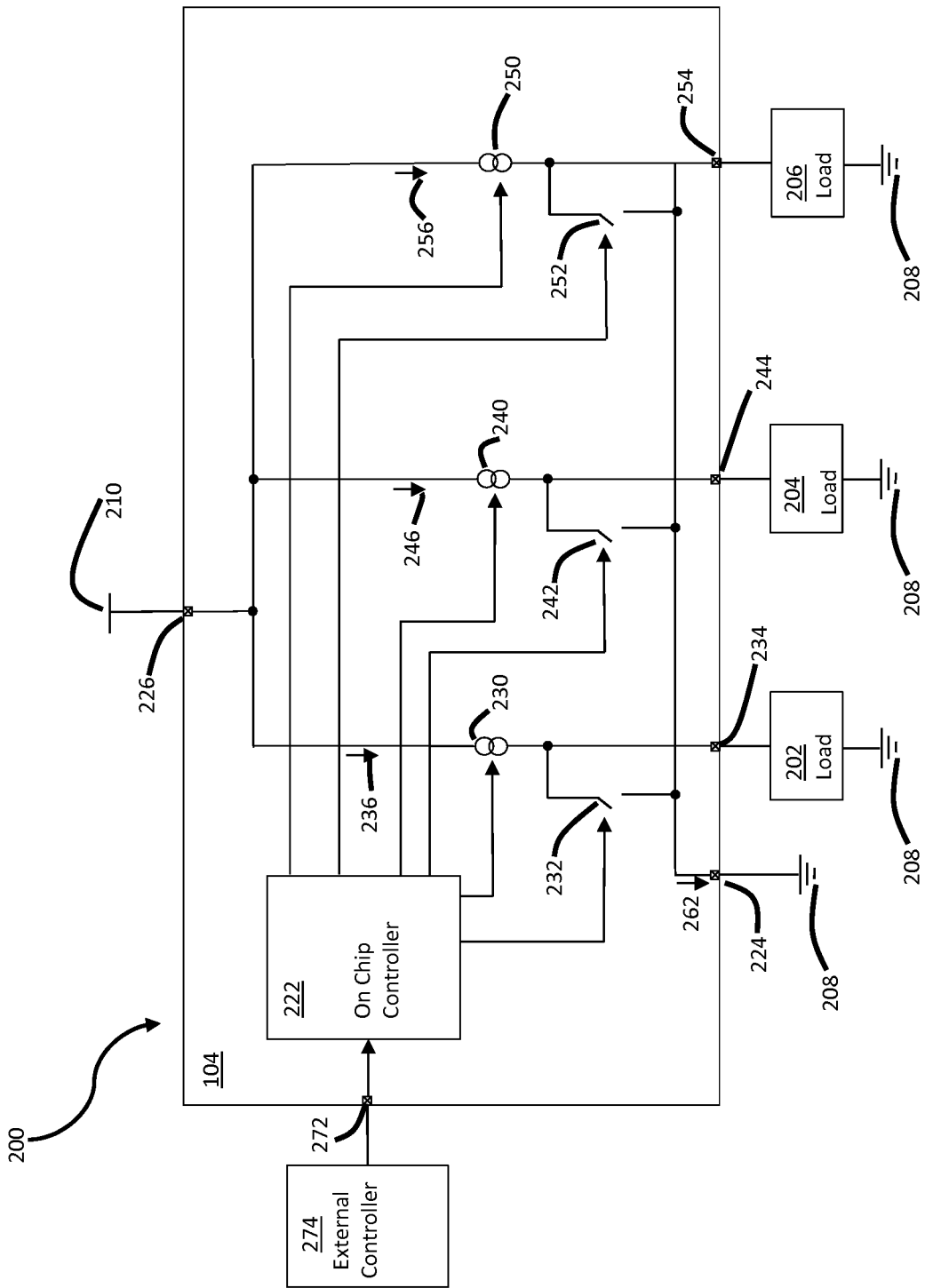
FIG. 2 illustrates an embodiment circuit for testing driving circuits.

FIG. 2 illustrates embodiment integrated driver circuit having on-chip test circuitry 200 for testing driving circuits. In an embodiment, the functionality of the current sources may be verified by connecting the outputs of some or all of the current sources together during a test mode. During this test mode, the total current may be measured using internal or external measurement circuitry. The sum of the current from the connected current sources may then be measured to determine if the current sources are defective. Integrated driver circuit having on-chip test circuitry 200 includes semiconductor device array 104. FIG. 2 illustrates three current sources: current source 230, current source 240, and current source 250 for clarity of illustration. However, semiconductor device array 104 may contain a large number of current sources. For example, in some embodiments, semiconductor device array 104 may contain between about 500 and about 10,000 current sources. Other embodiments may have greater or fewer current sources. In one embodiment, current source 230, current source 24, and current source 250 are adjustable current sources. In another embodiment, current source 230, current source 240, and current source 250 are controlled remotely using a communication interface.

Current sources 230, 240, and 250 are coupled to corresponding individual contact pads 234, 244, and 254 respectively. Individual contact pads 234, 244, and 254 are configured to be coupled to separate loads 202, 204, and 206 in a normal operation mode. Loads 202, 204, and 206 may be LED pixels. In addition, loads 202, 204, and 206 may be coupled to ground in a normal operation mode. Current sources 230, 240, and 250 are coupled to supply voltage contact pad 226, which is coupled to supply voltage 210 in both normal operation mode and test mode. Current sources 230, 240, and 250 are coupled to respective test switches 232, 242, and 252. Test switches 232, 242, and 252 are each coupled to ground contact pad 224. Ground contact pad 224 may be coupled to ground 208 in both a normal operation mode and in a test mode.

On-chip controller 222 on semiconductor device array 104, coupled to current sources 230, 240, and 250, and to test switches 232, 242, and 252, controls the output current of current sources 230, 240, and 250 in both a normal operation mode and a test mode. Also, on-chip controller 222 controls current sources 230, 240, and 250 by activating and deactivating them. Further, on-chip controller 222 may also control test switches 232, 242, and 252 in a test mode. Communications interface 272 is coupled to on-chip controller 222. External controller 274 may be coupled to communications interface 272. During testing, and during normal operation, external controller 274 may send commands to on-chip controller 222 via communications interface 272. Communications interface 272 may be a serial digital interface such as an IIC or SPI interface. Alternately, the communications interface may be a parallel interface or it may be a CAN, LIN, UART, or μs-bus interface.

In a normal operation mode, current sources 230, 240, and 250 are configured to output, for example, from about 1 mA to about 10 mA each to loads 202, 204, and 206. Alternatively, other current levels may be used. On-chip controller 222 turns current sources 230, 240, and 250 on and off during normal operation and in test mode. In both modes, on-chip controller 222 may receive commands from external controller 274 through a communications interface 272. Current sources 230, 240, and 250 produce less current in the test mode than they do in the normal operation mode. For example, these current sources may produce from about 100 μA to about 600 μA or from about 10 μA to about 60 μA in test mode. Consequently, in some embodiments, test switches 232, 242, and 252 may be implemented using small switches requiring only a fraction of size compared to current sources 230, 240, and 250, which do not have to be able to withstand the high current that the current sources 230, 240, and 250 produce in normal operation mode. On-chip controller 222 controls test switches 232, 242, and 252 that remain open in normal operation mode.

To measure the current of a single current source, on-chip controller 222 turns current source 230 on to produce current 236. Next, on-chip controller 222 closes test switch 232 to connect current source 230 to ground contact pad 224. On-chip controller 222 then turns all other current sources off, and disconnects them from ground contact pad 224 by closing their corresponding test switches. Thus, current 262 at ground contact pad 224 is about the same as current 236 produced by current source 230. Current 262 can then be measured from ground contact pad 224 using a contact pin.

To measure the sum of the current in multiple current sources, on-chip controller 222 turns on all of the current sources to be simultaneously measured and closes the test switches corresponding to the current sources to be measured. In some embodiments, the current sources may be grouped together. With three current sources to be measured, current sources 230, 240, and 250 produce respective currents 236, 246, and 256. When test switches 232, 242, and 252 are closed, current 262 is the sum of the current produced by individual current sources 230, 240, and 250 (currents 236, 246, and 256). A plurality of current sources may be connected to ground contact pad 224 through many test switches, and the sum of their currents can be measured. Any number of current sources may be coupled to ground contact pad 224 by corresponding test switches. In some embodiments, all current sources are coupled and tested at the same time. In other embodiments, for example, embodiments having very large arrays, current sources are tested in groups. During testing, an array may having a total of about 1000 current sources may be tested, for example, in groups of 100 at a time. Alternately, an array may have different numbers of test sources that are tested in groups of other sizes.

Figure 3:
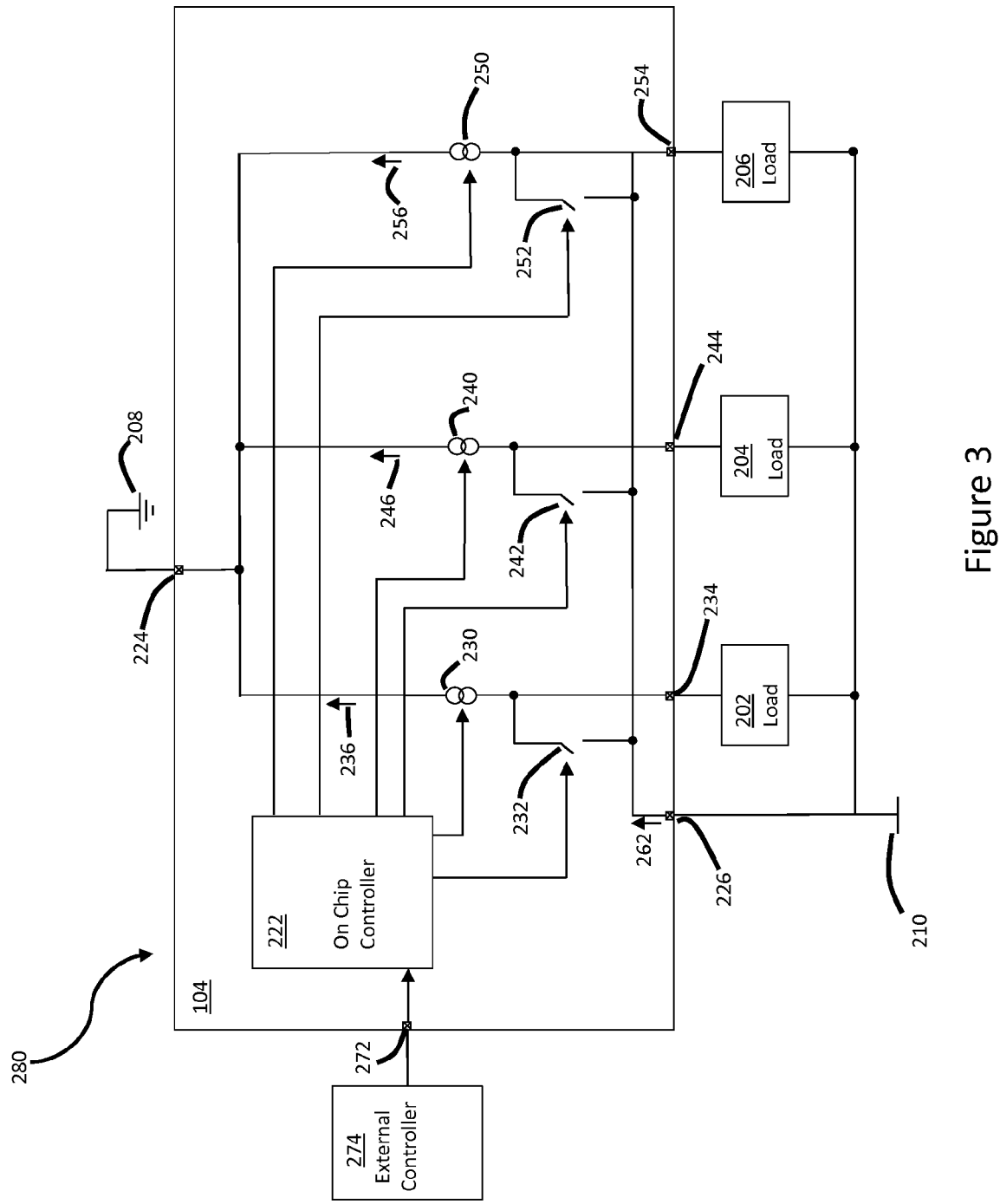
FIG. 3 illustrates another embodiment circuit for testing driving circuits.

Next, FIG. 3 illustrates embodiment integrated driver circuit having on-chip test circuitry 280 for testing driving circuits. FIG. 3 is similar to the embodiment of FIG. 2, except that current sources 230, 240, and 250 are directly connected to ground contact pad 224 instead of to supply voltage contact pad 226, as shown in FIG. 2. Loads 202, 204, and 206 are coupled to supply voltage 210 in FIG. 3 instead of to ground 208 in FIG. 2. Also, test switches 232, 242, and 252 are coupled to supply voltage contact pad 226 in FIG. 3 instead of to ground contact pad 224 in FIG. 2.

Figure 4:
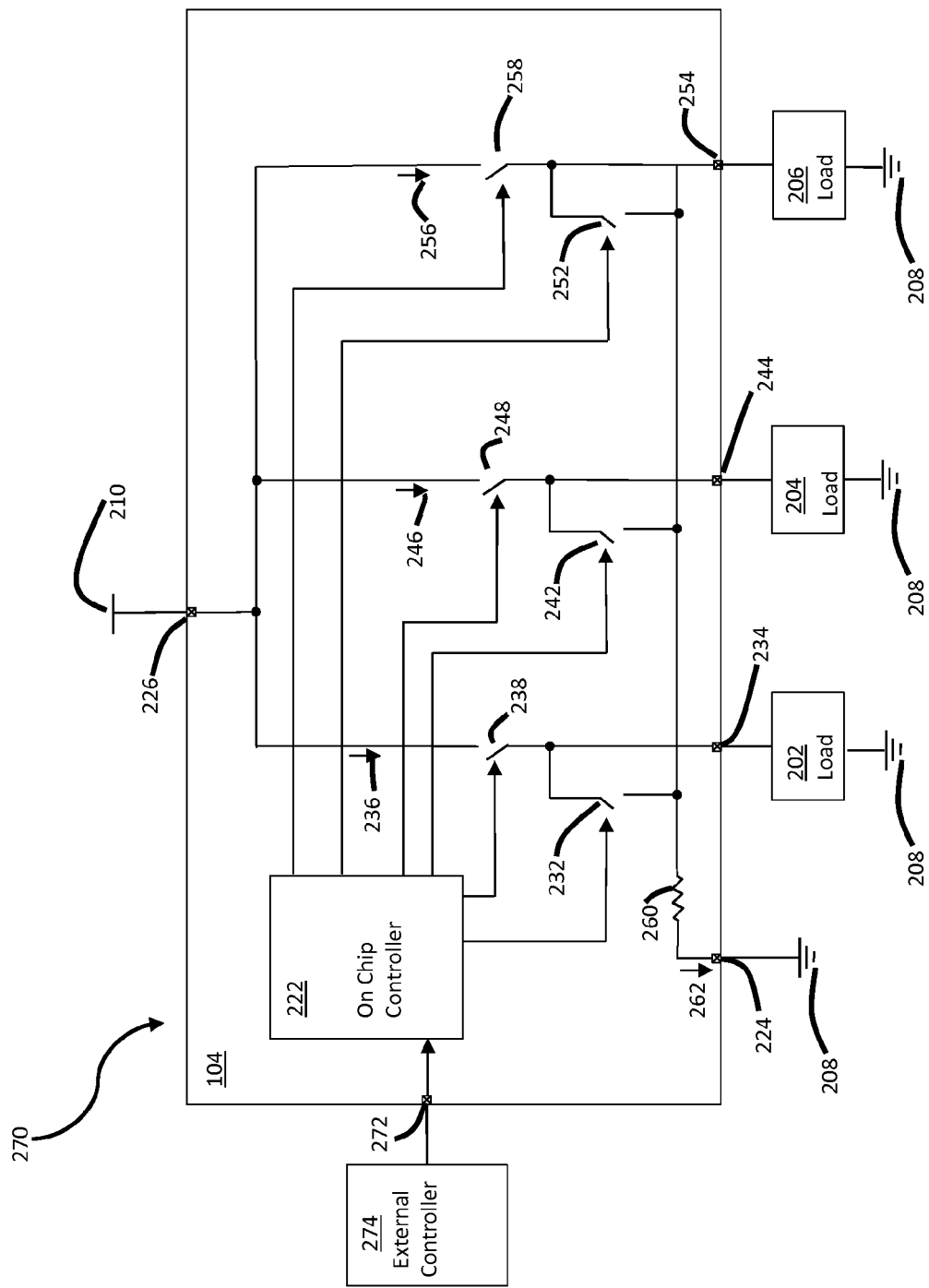
FIG. 4 illustrates a further embodiment circuit for testing driving circuits.

FIG. 4 illustrates embodiment integrated driver circuit having on-chip test circuitry 270 for testing driving circuits in which the driver is implemented using a switch instead of a current source. Except for the following differences, FIG. 4 is similar to FIG. 2 except that power switches 238, 248, and 258 in FIG. 4 replace current sources 230, 240, and 250 in FIG. 2. Resistor 260 in FIG. 4 is coupled between ground contact pad 224 and test switches 232, 242, and 252 to limit the current of power switches 238, 248, and 258 in test mode when they are coupled to ground contact pad 224. On-chip controller 222 activates and deactivates power switches 238, 248, and 258, by closing and opening them via control signals. In an embodiment, power switches 238, 248, and 258 are implemented using switching transistors, such as a MOSFET transistor. Alternatively, other transistor types, such as bipolar transistors may be used. Resistor 260 may be implemented using an on-chip resistance, using, for example, a resistor or a MOS device biased in the linear region, or it may be a partial power DMOS switch off. By testing the current of power switches 238, 248, and 258, the internal resistance of the power switches may be tested.

Figure 5:
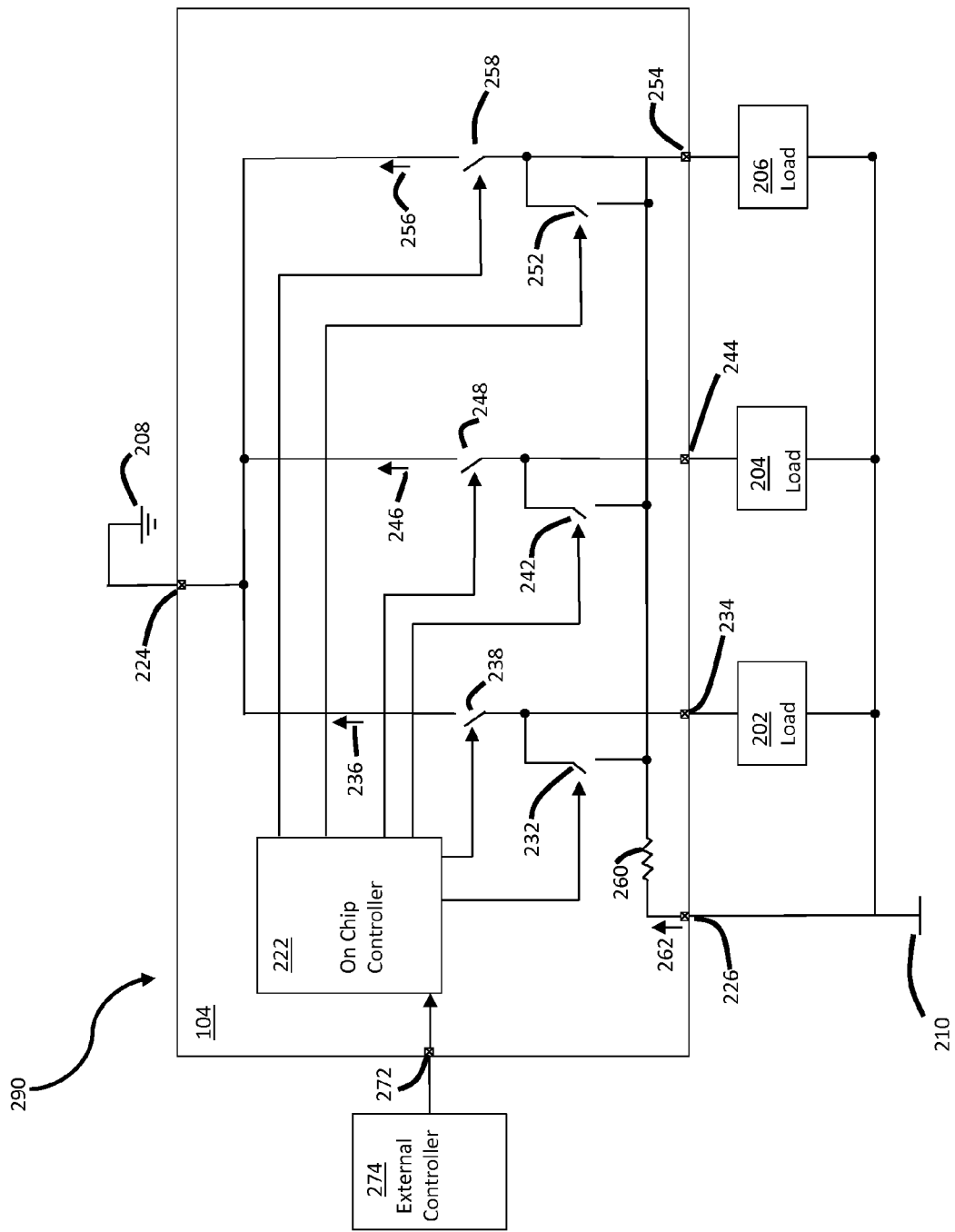
FIG. 5 illustrates a further embodiment circuit for testing driving circuits.

FIG. 5 illustrates embodiment integrated driver circuit having on-chip test circuitry 290 for testing driving circuits. Integrated driver circuit having on-chip test circuitry 290 in FIG. 5 is similar to integrated driver circuit having on-chip test circuitry 270 in FIG. 4 except that power switches 238, 248, and 258 are directly connected to ground contact pad 224 in FIG. 5 instead of to supply voltage contact pad 226 in FIG. 4. Also, loads 202, 204, and 206 are coupled to supply voltage 210 in FIG. 5 instead of to ground 208 in FIG. 4. In FIG. 5, resistor 260 is coupled to supply voltage contact pad 226 instead of to ground contact pad 224 in FIG. 4.

Figure 6:
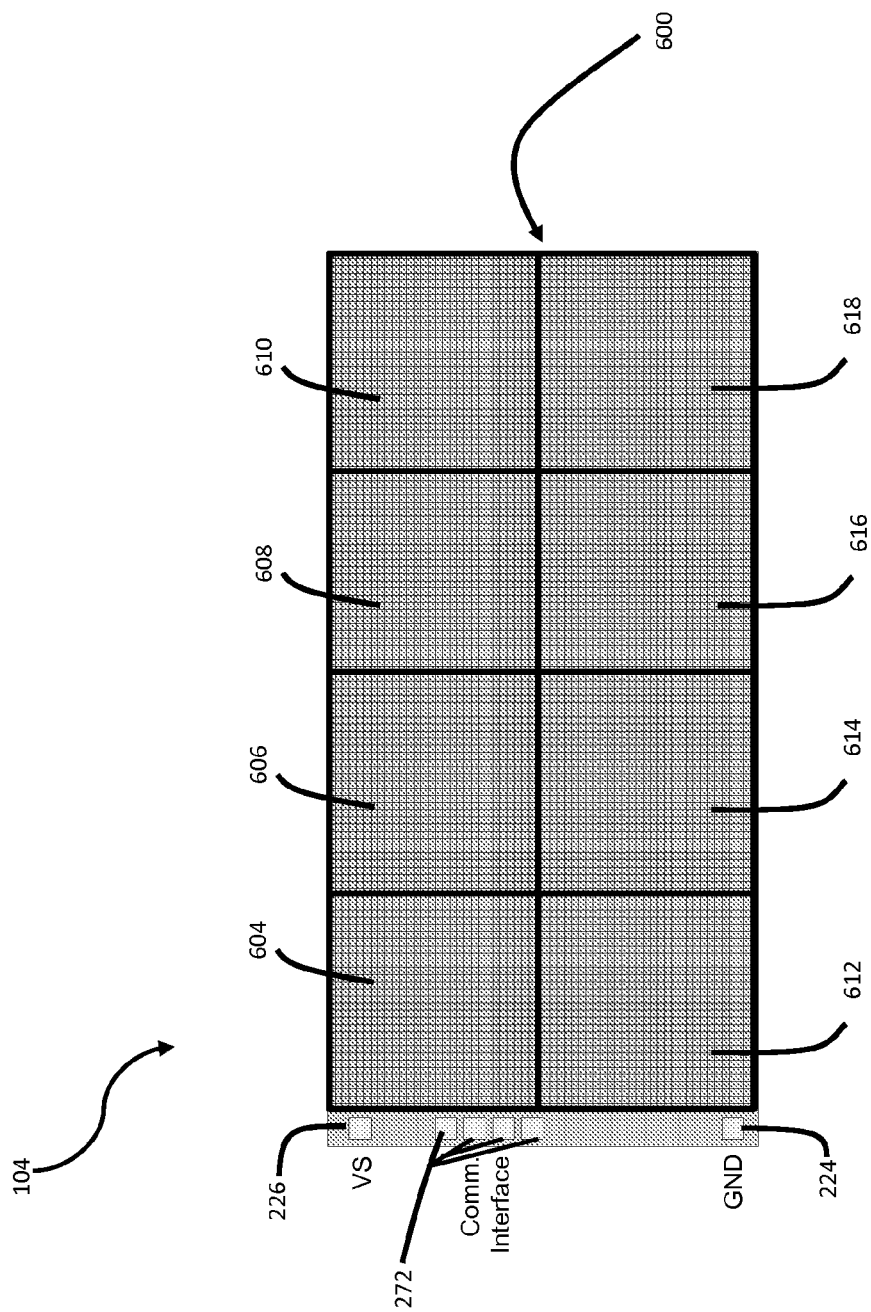
FIG. 6 illustrates an embodiment array of semiconductor devices for testing driving circuits.

FIG. 6 illustrates embodiment semiconductor device array 104 for testing driving circuits. Semiconductor device array 104 contains supply voltage contact pad 226, ground contact pad 224, communications interface 272, and integrated driver circuit having on-chip test circuitry 600. The squares on integrated driver circuit having on-chip test circuitry 600 represent driving circuits. For testing, integrated driver circuit having on-chip test circuitry 600 is placed on automatic test equipment (ATE). The driving circuits are divided into virtual groups, for example groups 604, 606, 608, 610, 612, 614, 616, and 618, as illustrated. An array of driving circuits containing 5000 driving circuits may, for example, be divided into 264 groups with 19 driving circuits in each group. Ground contact pad 224, supply voltage contact pad 226, communications interface 272, and at least one output pin per group is contacted by a probe of a probe card coupled to the ATE. For example, the output pin may be contacted to individual contact pad 234 in FIG. 2.

Initially, in an embodiment, a single driving circuit in group 604 is activated. The single driving circuit is activated to a current for normal operation mode, because the current does not pass through the corresponding test switch, which remains open. The other driving circuits in group 604 are deactivated. Next, the current is measured at the individual output pin for the activated driving circuit, and if the current is not within an acceptable range, the driving circuit fails. If the current is within an acceptable range, the driving circuit passes. If the single driving circuit passes, all the driving circuits in group 604 are activated and connected to a shared contact pad, for example, to ground contact pad 224. The driving circuits are activated at a reduced current in test mode, because the current passes through the test switches. The current for all of the driving circuits in group 604 is measured at the shared contact pad. When this measurement is within an acceptable range the group passes.

If the measurement is not within an acceptable range, group 604 fails, and may be split into subgroups to localize the failing driving circuit(s). For example, if group 604 contains 19 driving circuits, ten of the driving circuits may be activated and connected to the shared contact pad, while the other nine driving circuits are deactivated and disconnected. If a measurement of the ten driving circuits is within an acceptable range, the ten driving circuits are deactivated and disconnected, and the other nine driving circuits are activated and connected. However, if the measurement is not within the acceptable range, five of the ten driving circuits are activated and connected, and the other five are deactivated and disconnected. This may continue until the failing driving circuit is located. Testing is repeated for group 606, followed by groups 608, 610, 612, 614, 616, and 618, until all driving circuits are tested.

Figure 7:
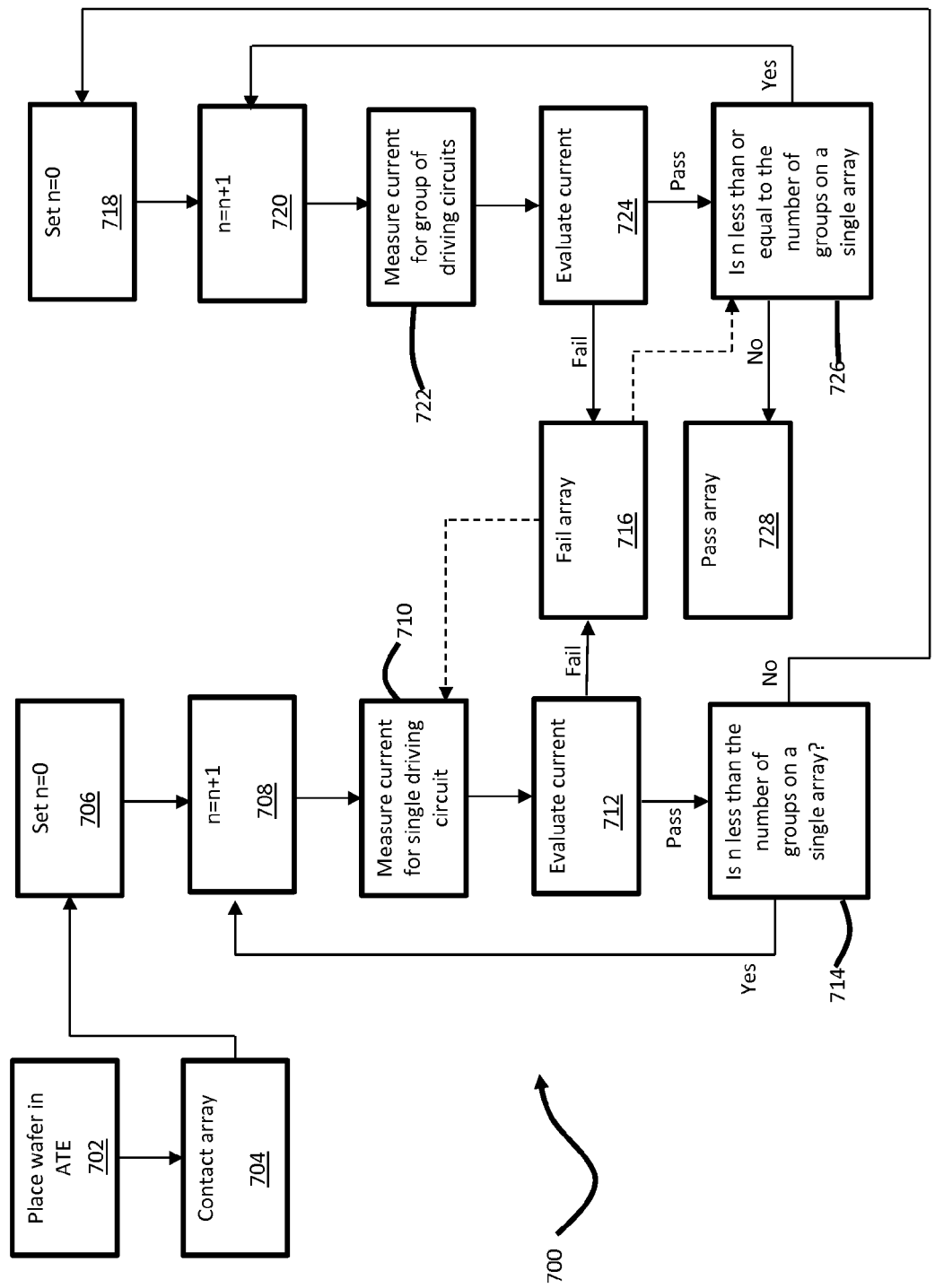
FIG. 7 illustrates a flowchart for an embodiment method for testing driving circuits.

FIG. 7 illustrates flowchart for an embodiment method 700 for testing driving circuits. Method 700 may be implemented using integrated driver circuits having on-chip test circuitry 200, 270, 280, or 290. Step 702 involves an operator or an automatic test handler placing a device under test, or a wafer containing multiple devices under test on a test fixture of an ATE. The devices under test may contain arrays of driving circuits. In step 704, the array is contacted using, for example, a probe card or other test fixture. For example, the probe card may contact the wafer with a ground probe, a supply voltage probe, one or more communications probe, and one probe per group of driving circuits.

In an embodiment, steps 706, 708, 710, 712, and 714 involve testing a single driving circuit in each group using a probe connected to an individual contact pad of the driving circuit to be tested to test the single driving circuit in normal operation mode. Counter n, used as a loop counter representing the group number may be implemented in the test software of the ATE or using dedicated hardware. Initially, step 706 sets counter n to zero. Next, in step 708, counter n is incremented to n+1. Then, in step 710, the current of a single driving circuit is measured. This may be accomplished by activating a single driving circuit in a group while deactivating all the other driving circuits in that group. Activating a driving circuit may involve turning a current source on or closing a power switch, while deactivating a driving circuit may involve turning a current source off or opening a power switch. The driving circuit being tested is activated to a normal operating current, which may be, for example, from about 1 mA to about 10 mA. The current does not pass through the test switches, so a normal current may be used, and the test switches are open. Then, the current at the individual contact pad is evaluated in step 712. If the current is not within an acceptable range, the driving circuit fails.

In some embodiments, a required device yield defines the proportion of devices that must operate within tolerance. A required device yield may allow for a certain number of failing devices to occur before the entire array is rejected. The distribution of the failures may affect the required device yield. For example, a cluster of failed devices in one region may make it more likely that the entire array will be failed. If it is not acceptable to have any failed driving circuits, the array of driving circuits fails if any device fails, for example in step 710, and testing is complete. However, if it is acceptable to have some failed driving circuits, testing may continue after step 710. For example, the process may, for example, return to step 710 to test another single driving circuit, which may involve contacting another probe to the corresponding individual contact pad for the new driving circuit to test. If the current of the single driving circuit is within an acceptable range, the test proceeds to step 714, where it is determined if n is greater than or equal to the number of groups. Then, if n is less than the total number of groups, the test goes back to step 708 to repeat steps 708, 710, 712, and 714.

However, if n is greater than or equal to the total number of groups, testing proceeds to step 718, where counter n is set to zero. Steps 718, 720, 722, 724, and 726 test the devices in a group together for multiple groups. Next, in step 720, n is set to n+1. In step 722, the current for the entire group of driving circuits is measured by activating them and connecting the driving circuits in the group to a shared contact pad, such as a ground contact pad. Connecting the driving circuits may be performed by closing the test switches corresponding to the driving circuits. The driving circuits and test switches may be controlled by an on-chip controller, which in turn may be controlled by an external controller. In step 722, the driving circuits are activated to a current lower than that in the normal operation mode. For example, the current may be $\frac{1}{100}$ of that in normal operation mode, or from about 10 µA to about 60 µA, to protect the test switches. The current is measured through the output probe at the shared contact pad. The current measured is equal to the sum of the currents in all the driving circuits.

Next, in step 724, the current at the shared contact pad is evaluated to determine if it is within an acceptable range. If the current is not within an acceptable range, the test goes to step 716. If it is not acceptable to have any failed driving circuits, testing ends. However, if it is acceptable to have some failed driving circuits, for example, the tester may pinpoint which driving circuit(s) failed by dividing the group into subgroups and repeating steps 718, 720, 722, and 724 for the subgroups.

On the other hand, if the current is within an acceptable range, the test goes to step 726 to determine if n is less than the total number of groups. If n is less than the total number of groups, the test repeats steps 720, 722, 724, and 726 for the next group. If n is greater than or equal to the total number of groups, in step 728, the entire array passes.

In one example, 19 driving circuits may be measured in a group to maintain a desired testing accuracy. 264 groups of 19 driving circuits each may be created in an array containing 5000 driving circuits. If the test time is 2 ms per group, the total test time will be about 530 ms for testing all the groups (not including testing individual driving circuits.) Testing a single driving circuit per group takes 50 µs per driving circuit. Thus, testing 16 driving circuits will take an additional 0.8 ms. Pinpointing a failed driving circuit would increase the test time.

Figure 8:
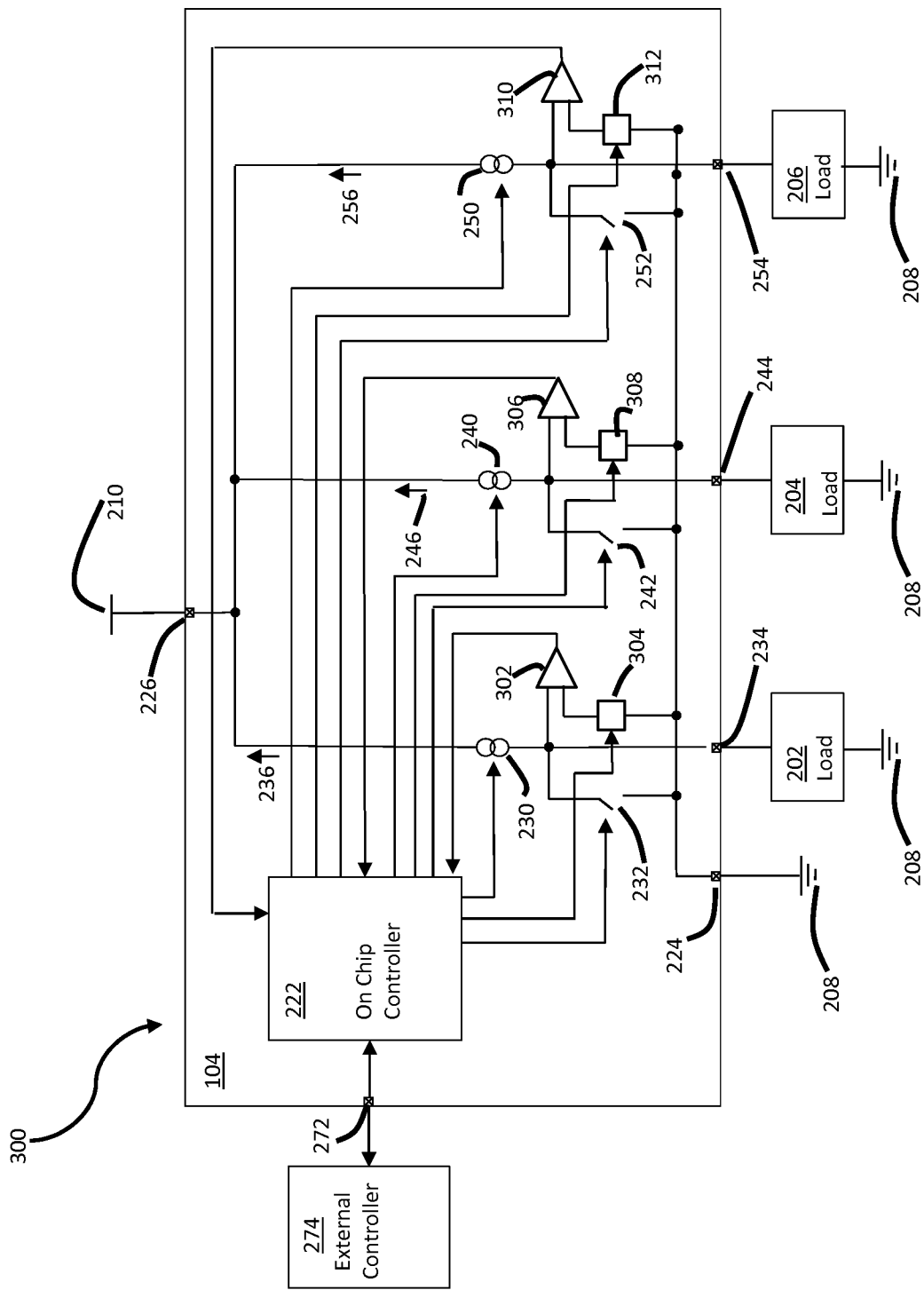
FIG. 8 illustrates an embodiment circuit for testing driving circuits.

FIG. 8 illustrates embodiment integrated driver circuit having on-chip test circuitry 300 for testing driving circuits. Integrated driver circuit having on-chip test circuitry 300 is capable of testing the current sources simultaneously. In test mode, the current sources being simultaneously tested are coupled to ground by corresponding test switches, and the current sources are evaluated using corresponding comparators. Integrated driver circuit having on-chip test circuitry 300 includes semiconductor device array 104. FIG. 8 illustrates three current sources: current source 230, current source 240, and current source 250, for clarity of illustration. However, semiconductor device array 104 may contain a large number of current sources. For example, in some embodiments, semiconductor device array 104 may contain from about 500 to about 10,000 current sources.

Current sources 230, 240, and 250 are coupled to corresponding individual contact pads 234, 244, and 254. Individual contact pads 234, 244, and 254 are configured to be coupled to separate loads 202, 204, and 206 in normal operation mode. Loads 202, 204, and 206 may be LED pixels, which may be coupled to ground in a normal operation mode. Current sources 230, 240, and 250 are coupled to supply voltage contact pad 226, which is coupled to supply voltage 210. Also, current sources 230, 240, and 250 are coupled to corresponding test switches 232, 242, and 252. Test switches 232, 242, and 252 are coupled to ground contact pad 224, which may be coupled to ground 208. A first input of comparators 302, 306, and 310 is coupled to the corresponding current sources 230, 240, and 250, and to the corresponding test switches 232, 242, and 252. A second input of comparators 302, 306, and 310 is coupled to corresponding voltage references 304, 308, and 312.

On-chip controller 222 on semiconductor device array 104 is coupled to current sources 230, 240, and 250, to test switches 232, 242, and 252, and to voltage references 304, 308, and 312. On-chip controller controls the current sources 230, 240, and 250 by activating and deactivating them. Also, on-chip controller 222 controls test switches 232, 242, and 252 in a test mode. The output of comparators 302, 306, and 310 feeds back to on-chip controller 222. Communications interface 272 is coupled to on-chip controller 222. External controller 274 may be coupled to on-chip controller 222 via communications interface 272. External controller 274 may send commands to on-chip controller 222 via communications interface 272. Also, during testing, on-chip controller 222 may send data to external controller 274 using communications interface 272. Communications interface 272 may be a serial digital interface such as an IIC or SPI interface. Alternately, the communications interface may be a parallel interface or a CAN, LIN, UART, µs-bus interface.

On-chip controller 222 activates current sources 230, 240, and 250 and closes test switches 232, 242, and 252 to connect the driving circuits to ground contact pad 224. External controller 274 may control on-chip controller 222 via communications interface 272. The voltage under test is developed by the current from the current sources flowing through the parasitic resistance of the system. Then, on-chip controller 222 causes voltage references 304, 308, and 312 to output a minimum voltage references. Next, on-chip controller 222 evaluates the results of the outputs of comparators 302, 306, and 310, setting a test bit to pass for each driving circuit that has an output voltage that is greater than the minimum reference voltage, and setting a test bit to fail for each driving circuit that has an output voltage that is less than the minimum reference voltage. Then, on-chip controller 222 causes voltage references 304, 308, and 312 to output a maximum voltage reference. On-chip controller 222 evaluates the results of the outputs of comparators 302, 306, and 310, setting a test bit to pass for each current source that has an output voltage that is less than the maximum reference voltage and setting a test bit to fail for each current source that has an output voltage that is more than the maximum reference voltage. Finally, on-chip controller 222 transmits the test bits to external controller 274 via communications interface 272.

Figure 9:
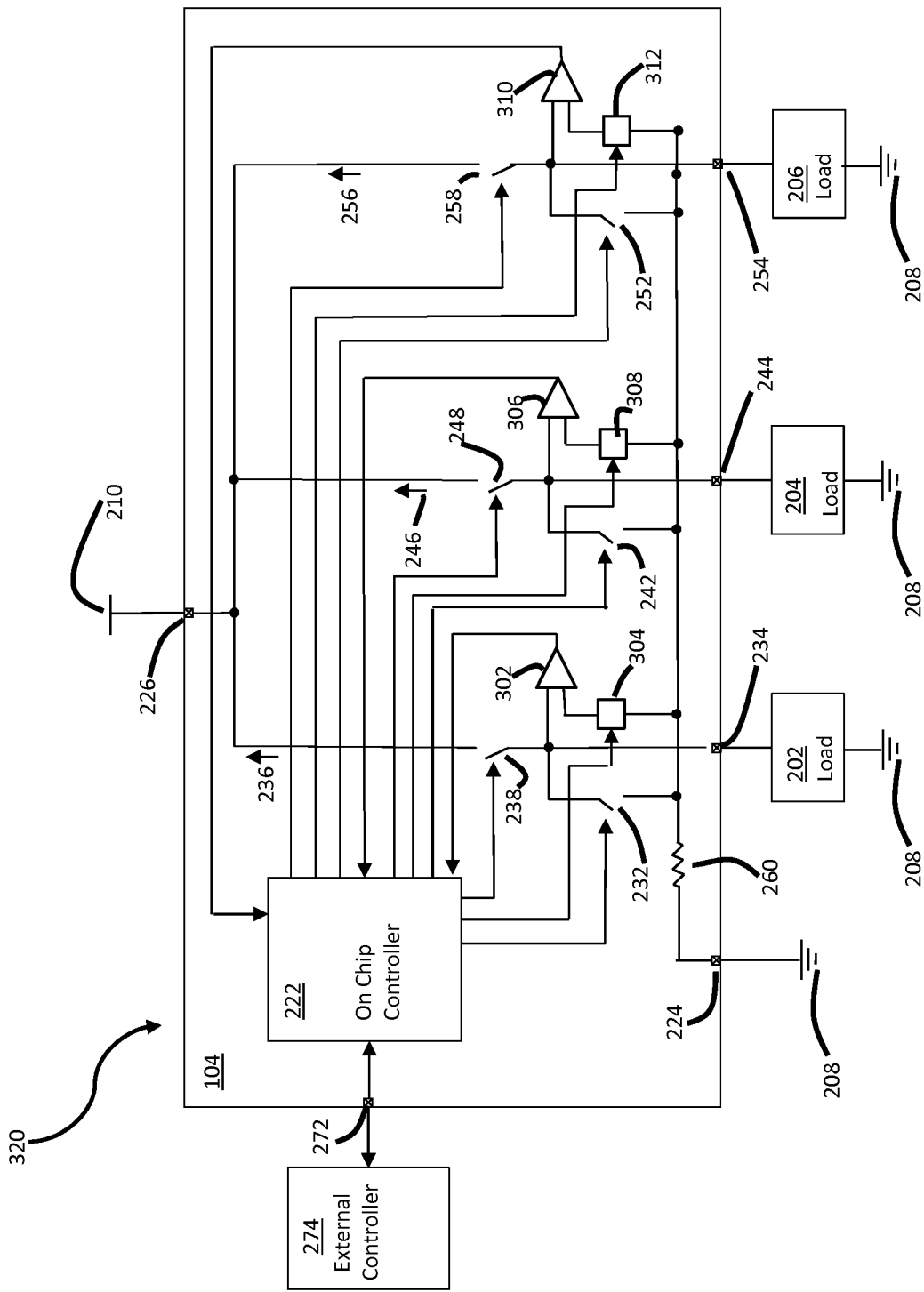
FIG. 9 illustrates another embodiment circuit for testing driving circuits.

FIG. 9 is similar to FIG. 8 in its depiction of integrated driver circuit having on-chip test circuitry 320. Current sources 230, 240, and 250 in FIG. 8 are replaced by power switches 238, 248, and 258 in FIG. 9. When power switches 238, 248, and 258 and test switches 232, 242, and 252 are closed, supply voltage 210 is connected across the power switches 238, 248, and 258, test switches 232, 242, and 252. Resistor 260 is between ground contact pad 224 and test switches 232, 242, and 252. The voltage across resistor 260 and test switches 232, 242, and 252 is compared with voltages references 304, 308, and 312 by comparator 302, 306, and 310.

Figure 10:
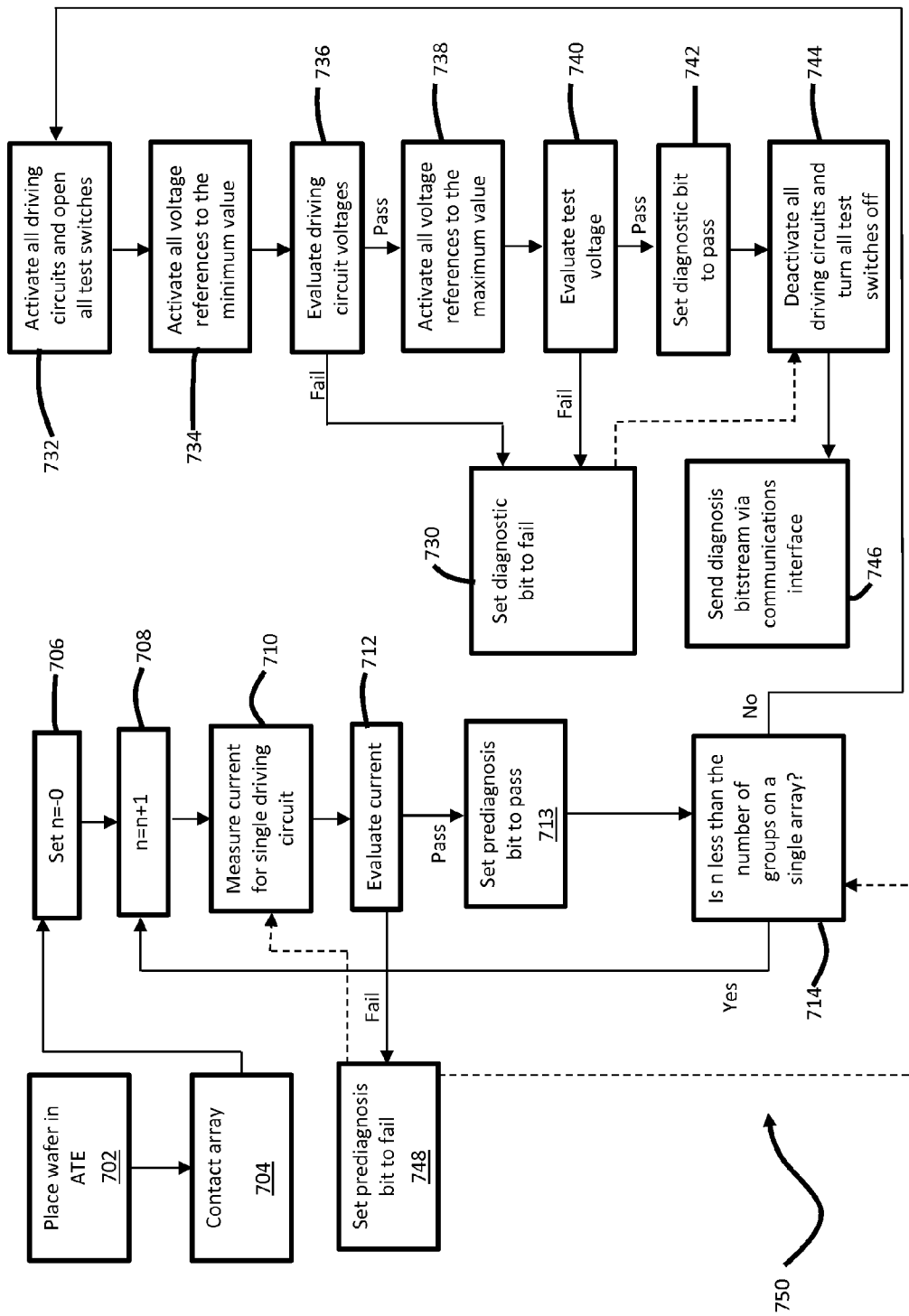
FIG. 10 illustrates a flowchart for an embodiment method for testing driving circuits.

FIG. 10 illustrates embodiment method 750 of testing driving circuits. Method 750 may be implemented using integrated driver circuits having on-chip test circuitry 300 and 320. First, step 702 involves an operator or an automatic test handler placing a device under test or a wafer containing multiple devices under test on a test fixture of an ATE. Each device under test may contain an array of driving circuits. In step 704, the array is contacted using, for example, a probe card. For example, the probe card may contact the wafer with a ground probe, a supply voltage probe, one or more communications probe, and one probe per group of driving circuits.

In an embodiment, steps 706, 708, 710, 712, 713, and 714 involve testing a single driving circuit in each group using a probe connected to the driving circuit to be tested using an individual contact pad. Counter n, used as a loop counter for the group may be implemented in the test software of the ATE or using dedicated hardware. Initially, step 706 sets counter n to zero. Next, in step 708, counter n is incremented to n+1. In step 710, the current of a single driving circuit is measured. This may be performed by activating a single driving circuit in a group while deactivating all the other driving circuits in that group. Activating a driving circuit may involve turning a current source on or closing a power switch, while deactivating a driving circuit may involve turning a current source off or opening a power switch. The driving circuit is activated to a normal operating current in step 710, which may be from about 1 mA to about 10 mA. In step 710, the current does not pass through the test switches, so a normal current may be used, and the test switches are open. The current at the individual contact pad is then evaluated in step 712. In some embodiments, a required device yield defines the proportion of the devices that must be effective.

A device yield may allow for a certain number of failing devices to occur before the entire array is rejected. The distribution of the failed devices may affect the acceptable device yield. For example, a cluster of failed devices in one region may make it more likely that the entire array will be failed. If it is not acceptable to have any failed driving circuits, the array of driving circuits fails if a single driving circuit fails, and testing is complete. If it is acceptable to have some failed driving circuits, testing may continue. For example, the test may return to step 710 to test another single driving circuit in the region, which may involve contacting another probe to the corresponding individual contact pad for the new driving circuit to test. If the current of the single driving circuit is within an acceptable range, the test proceeds to step 714, where the test determines if n is equal to the number of groups in the array of driving circuits. If n is less than the total number of groups, the test goes back to step 708 to repeat steps 708, 710, 712, and 714, for a device in the next group.

After step 712, if the driving circuit fails, step 748 sets a prediagnosis bit to fail. Each individual driving circuit tested corresponds to a prediagnosis bit, which verifies the fault location, which could be used to verify a systematic problem during production. If it is not acceptable to have any failing driving circuits, testing ends. However, if it is acceptable to have some failed driving circuits, testing proceeds, for example to step 714. If the driving circuit passes, step 713 sets the prediagnosis bit to pass, and then proceeds to step 714. If n is greater than or equal to the number of groups in step 714, testing proceeds to step 732.

In steps 732, 734, 736, 738, 740, 742, and 744, driving circuits are simultaneously tested in test mode by connecting each tested driving circuit to a corresponding comparator using a corresponding test switch. First, in step 732, all driving circuits to be simultaneously tested are activated and the corresponding test switches are closed, connecting each tested driving circuit to the respective comparator. In step 732, the driving circuits are activated to a current that is lower than that in a normal operation mode, for example a test mode current from about 10 µA to about 60 µA when the current in normal operation mode is from about 1 mA to about 10 mA. This may be done by signaling an on-chip controller through a communications interface from an external controller to control the driving circuits and test switches. Next, in step 734, the voltage references corresponding to the driving circuits are set to the minimum value, for example 500 mV. This step may be performed by a signal through a communications interface from an external controller signaling an on-chip controller to set the voltage references to the minimum value. Alternately, a signal from the on-chip controller may independently set the voltage reference. Next, in step 736, the voltage of the driving circuits is compared to the voltage of the reference signals. Step 736 may be performed by a comparator comparing the voltage of the driving circuit to the voltage of the comparator and sending the comparator output to the on-chip controller. In step 738, the voltage difference is evaluated by the on-chip controller of the external controller. If a driving circuit fails, a corresponding diagnosis bit is set to fail in step 730. If it is not acceptable to have any failing driving circuits, testing stops. Alternately, if it is acceptable to have some failed driving circuits, testing proceeds in step 738. If the voltages of all the driving circuits pass, testing proceeds to step 738.

In step 738, the voltage references are set to a maximum value, for example 550 mV. This may be performed by a signal from a control interface signaling the on-chip controller, or the on-chip controller may signal independently. Next, in step 740, the driving circuit voltage is evaluated. If a driving circuit fails, a diagnosis bit is set to fail in step 730. The diagnosis bit represents whether or not each of the tested driving circuits failed. For the driving circuits that pass, diagnosis bits are set to pass. The driving circuits are deactivated and the test switches opened in step 744. Then, in step 746, the diagnosis bit stream is transmitted to an external controller by a communications interface.

In some embodiments, method 750 has a short test time when all driving circuits are being tested simultaneously. In some embodiments, a complete measurement may take, for example, about 50 ms using a simultaneous measurement. Measuring the nominal current of physical devices in a normal operating mode might take about an additional 0.8 ms.

Figure 11:
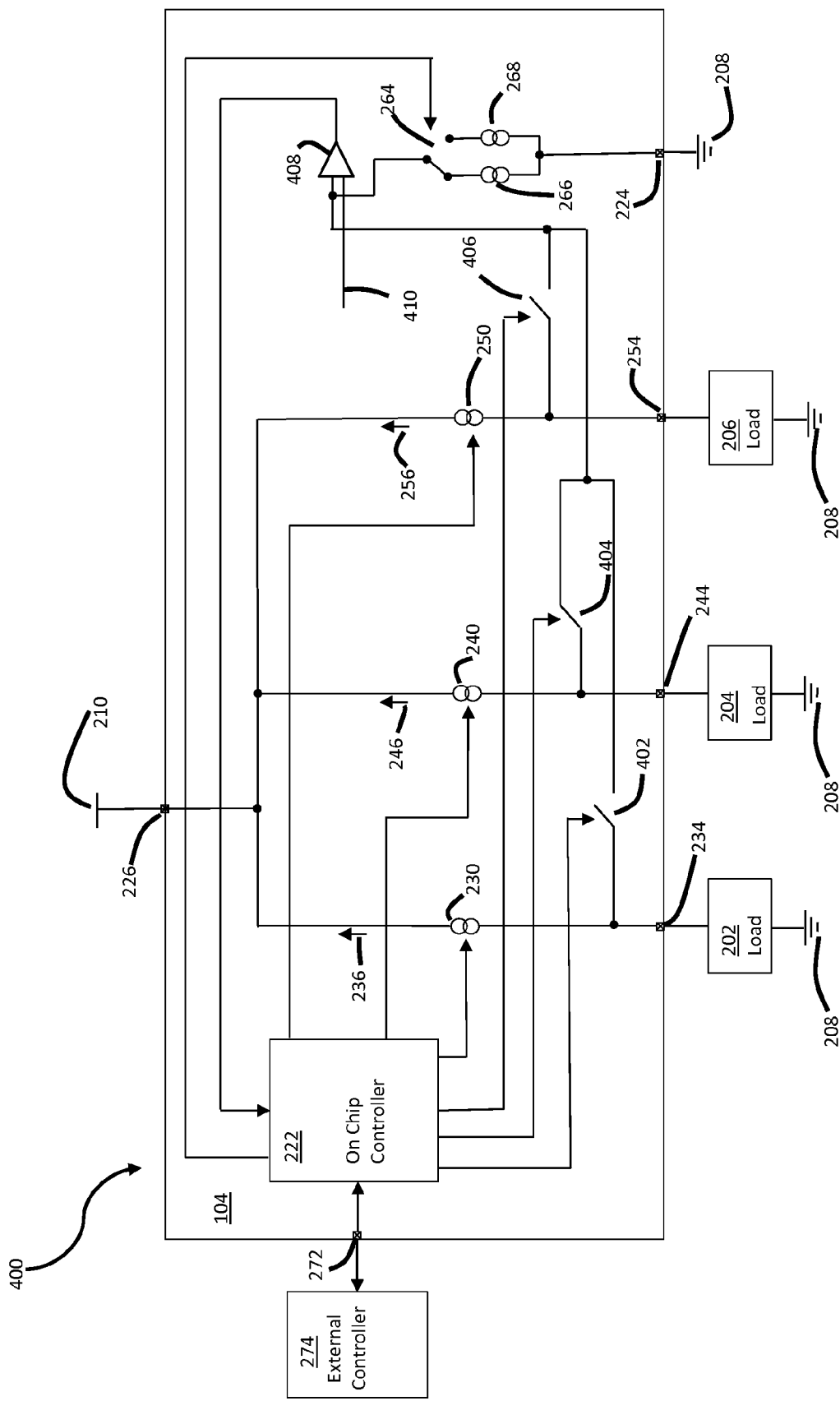
FIG. 11 illustrates an embodiment circuit for testing driving circuits.

FIG. 11 illustrates embodiment integrated driver circuit 400 having on-chip test circuitry 400, which includes semiconductor device array 104. Integrated driver circuit having on-chip test circuitry 400 can test multiple current sources by connecting in sequence each current source in a group to be tested to a shared comparator, while optionally testing multiple groups simultaneously using separate comparator circuits. FIG. 11 illustrates three current sources: current source 230, current source 240, and current source 250 for clarity of illustration. However, semiconductor device array 104 may contain a large number of current sources. For example, in some embodiments, semiconductor device array 104 may contain between about 500 and about 10,000 current sources. Alternatively, other numbers of current sources may be used.

Current sources 230, 240, and 250 are coupled to corresponding individual contact pads 234, 244, and 254. Individual contact pads 234, 244, and 254 are configured to be coupled to separate loads 202, 204, and 206 in normal operation mode. Loads 202, 204, and 206 may be LED pixels. Additionally, loads 202, 204, and 206 may be coupled to ground in normal operation mode. Current sources 230, 240, and 250 are coupled to supply voltage contact pad 226, which is coupled to supply voltage 210. Also, current sources 230, 240, and 250 are coupled to respective test switches 402, 404, and 406. Test switches 232, 242, and 252 are coupled to comparator 408.

A second input of comparator 408 is coupled to a constant voltage, which may be equal to about half of supply voltage 210, while a first output of comparator 408 is coupled to switch 264. Switch 264 couples the first input of comparator 408 to either minimum test current source 266 or to maximum test current source 268. Minimum test current source 266 and maximum test current source 268 are coupled to ground contact pad 224, which may be connected to ground 208. Ground contact pad may be coupled to ground 208.

On-chip controller 222 on semiconductor device array 104 is coupled to current sources 230, 240, and 250, to test switches 402, 404, and 406. Additionally, on-chip controller 222 is coupled to switch 264. On-chip controller 222 controls the output current of current sources 230, 240, and 250 in both a normal operation mode and a test mode. Current sources 230, 240, and 250 are controlled by activating and deactivating them. Also, on-chip controller 222 also controls test switches 402, 404, and 406 and switch 264 in a test mode. External controller 274 is coupled to on-chip controller 222 via communications interface 272. The output of comparator 408 is fed back to chip controller 222, which may relay this to external controller 274 by way of communications interface 272. During testing, and during normal operation, external controller 274 may send commands to on-chip controller 222 via communications interface 272. Communications interface 272 may be a serial digital interface such as an IIC or SPI interface. Alternately, the communications interface may be a parallel interface or it may be a CAN, LIN, UART, or μs-bus interface.

Figure 12:
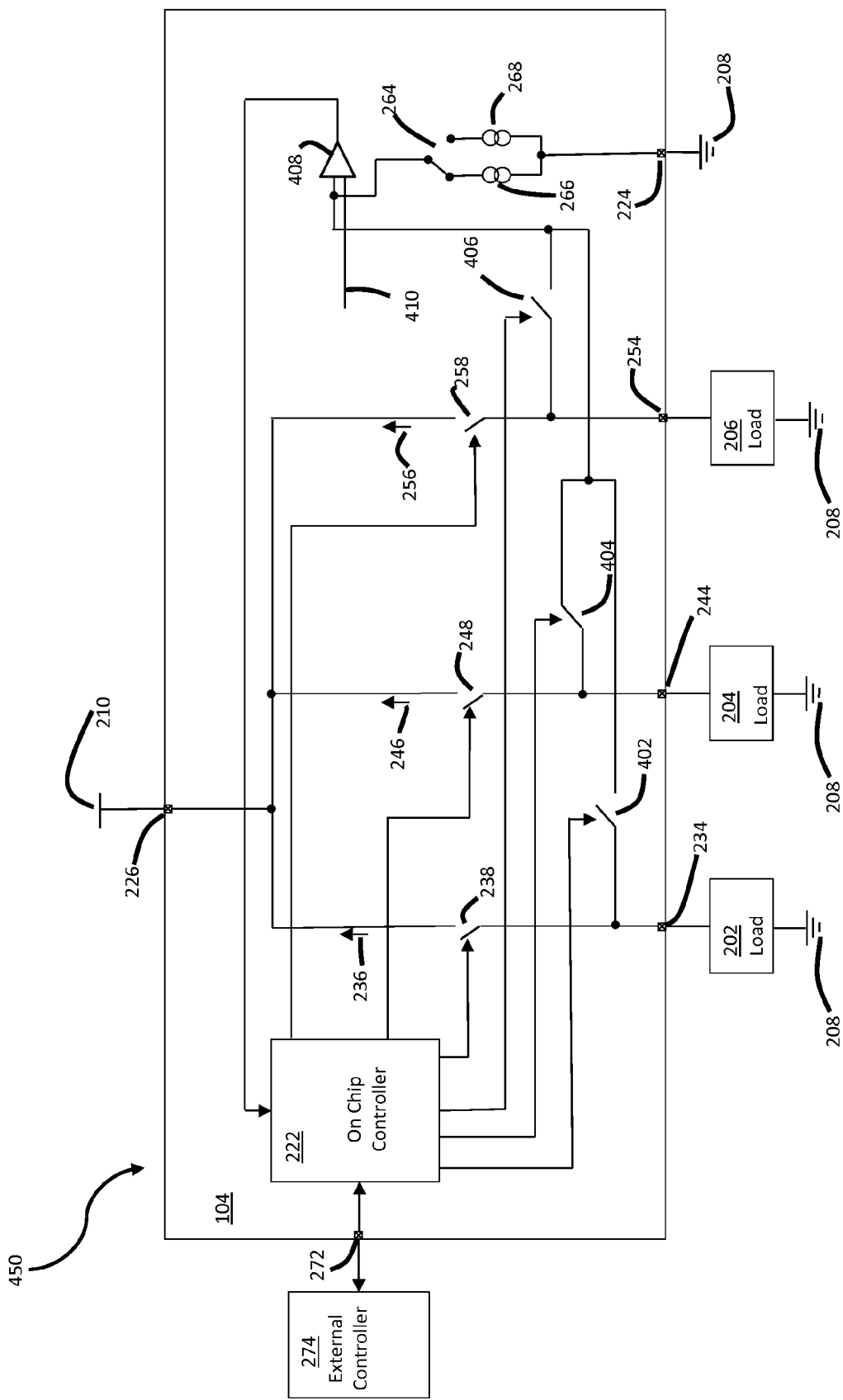
FIG. 12 illustrates another embodiment circuit for testing driving circuits.

Integrated driver circuit having on-chip test circuitry 450 illustrated in FIG. 12 is similar to integrated driver circuit having on-chip test circuitry 400 in FIG. 11, with the exception that the driving circuits are implemented using power switches 238, 248, and 258 instead of current sources.

Figure 13:
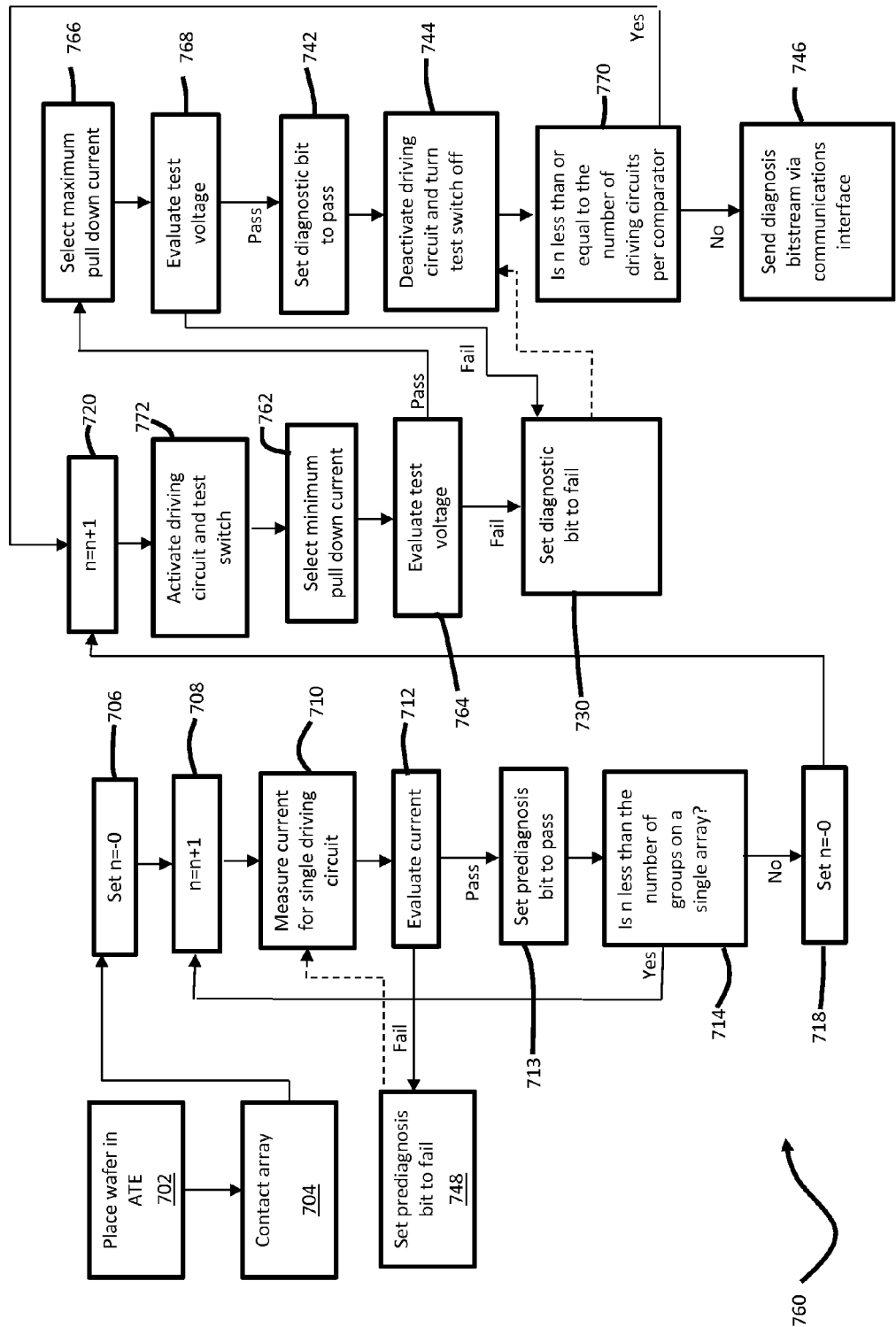
FIG. 13 illustrates a flowchart for an embodiment method for testing driving circuits.

FIG. 13 illustrates embodiment method 760 of testing driving circuits. Method 760 may be implemented using integrated driver circuits having on-chip test circuitry 400 and 450. Initially, step 702 involves an operator or an automatic test handler placing a device under test, or a wafer containing multiple devices under test on a test fixture of an ATE. Each device under test may contain an array of driving circuits. Next, in step 704, the array is contacted using, for example, a probe card. For example, the probe card may contact the wafer with a ground probe, a supply voltage probe, a communications probe, and one probe per group of driving circuits.

In an embodiment, steps 706, 708, 710, 712, 713, 714, and 748 involve testing a single driving circuit in each group using a probe connected to the driving circuit to be tested. Counter n, used as a loop counter for the group may be implemented in the test software of the ATE or using dedicated hardware. Initially, step 706 sets counter n to zero. Next, in step 708, counter n is incremented to n+1. In step 710, the current of a single driving circuit is measured. This may be performed by activating a single driving circuit in a group while deactivating all the other driving circuits in that group. Activating a driving circuit may involve turning a current source on or closing a power switch, while deactivating a driving circuit may involve turning a current source off or opening a power switch. In step 710, the driving circuit is activated to a normal operating current, which may be from about 1 mA to about 10 mA. The current does not pass through the test switches in step 710, so a normal current may be used, while the test switches are open. The current at the individual contact pad is then evaluated in step 712. If the current is not within an acceptable range, the driving circuit fails.

If the current of the single driving circuit is not within an acceptable range, the test continues to step 748, where it sets a prediagnosis bit to fail. In some embodiments, a required device yield defines the proportion of the devices that must be effective. A required device yield may allow for a certain number of failing devices to occur before the entire array is rejected. The distribution of the failures may affect the acceptable device yield. For example, a cluster of failed devices in one area may make it more likely that the entire array will be failed. If it is not acceptable to have any failed driving circuits, the array of driving circuits fails if a single driving circuit fails, and testing is complete. If it is acceptable to have some failed driving circuits, testing may continue. For example, the process may return to step 710 to test another single driving circuit in the region. This may involve contacting another probe to the corresponding individual contact pad for the new driving circuit to test. If the current of the single driving circuit is within an acceptable range, the test sets a prediagnosis bit to pass in step 713, and proceeds to step 714, where the test determines if n is greater than or equal to the number of groups in the array of driving circuits. If n is less than the total number of groups, the test goes back to step 708 to repeat steps 708, 710, 712, 713, and 714 for the next group. On the other hand, if n is greater than or equal to the total number of groups, the test goes to step 718.

Steps 718, 720, 772, 762, 764, 730, 766, 768, 742, 744, 770, and 746 test multiple driving circuits in a group by sequentially connecting them to a comparator, and optionally testing multiple groups in parallel. First, step 718 sets counter n to zero and step 720 sets n to n plus one. In step 772, one driving circuit per group is activated by closing a corresponding test switch. An on-chip controller may activate the driving circuit and close the test switch, which may be externally controlled via a communications interface by an external controller. Then, in step 762, the minimum test current is connected to the input of the comparator. This step may be achieved by an on-chip controller connecting a switch to the minimum test current source. In step 764, the output of the comparator is evaluated, for example by an on-chip controller. If the driving circuit fails, step 730 sets a diagnostic bit to fail. If it is not acceptable to have any failed driving circuits, testing ends. If it is acceptable to have failed driving circuits, testing continues, for example in step 744.

If the driving circuit passes, testing continues in step 766, where the maximum test current is selected. This may be achieved by switching the comparator input from the minimum current current source to the maximum current current source. Next, in step 768, the test voltage is evaluated, possibly by the on-chip controller. If the test voltage is not within an acceptable range, the test goes to step 730. If the test voltage is within an acceptable range, a diagnostic bit is set to pass in step 742. Then, in step 744, the driving circuit is deactivated and disconnected from the comparator by opening the corresponding test switch. In step 770, if n is less than the number of driving circuits per comparator, the test proceeds to step 720 to test the next driving circuit in the group. If n is greater than or equal to the number of driving circuits, the diagnosis bit stream and prediagnosis bit stream are sent by a communications interface from the on-chip controller in step 746.

In method 760, one comparator and two current sources may be used for all driving circuits on a chip. Alternately, a separate comparator and two current sources can be used for each driving circuit, leading to a higher device count but a lower testing time, because all devices can be tested in parallel. In some embodiments, the driving circuits can be divided into groups of any size where all driving circuits in a group are connected to the same comparator with a separate comparator for each group, with an intermediate device count and intermediate test time. Hence, a tradeoff may be made between test time and device count.

In accordance with an embodiment, an integrated circuit includes a plurality of devices on the integrated circuit. Each device includes a driving circuit, an individual contact pad coupled to a first terminal of the driving circuit, and a switch having a first terminal coupled to the first terminal of the driving circuit. Also, the integrated circuit includes a shared contact pad coupled to a second terminal of each switch of the plurality of devices. The integrated circuit also includes a controller coupled to each switch of the plurality of devices, where the controller is configured to selectively control each switch to couple each driving circuit to the shared contact pad. In some embodiments, the controller is further configured to selectively activate the driving circuit in a normal operation mode and in a test mode, such that an output current of the driving circuit is lower in the test mode than in the normal operation mode. The output current in the test mode may be less than one-tenth the output current in the normal operation mode.

In an embodiment, the controller is further configured to operate in a normal operation mode and in a test mode, the driving circuit is configured to output a current to the individual contact pad in the normal operation mode, and the driving circuit is configured to open circuit the individual contact pad in the test mode. The driving circuit may include a current source in some examples.

In an embodiment, the driving circuit includes a power switch, and the integrated circuit further includes a resistor coupled between the shared contact pad and the switch. The individual contact pad may be configured to be coupled to a corresponding LED during a normal operation mode. In some embodiments, the plurality of devices further includes a comparator having a first terminal coupled to the first terminal of the driving circuit and a voltage reference coupled to a second input terminal of the comparator. The controller may be further configured to control the reference voltage.

In an embodiment, the integrated circuit further includes a common terminal of a current switch coupled to the second terminal of the switch, a first reference current source coupled to a first terminal of the current switch, and a second reference current source coupled to a second terminal of the current switch. The controller may be further configured to connect the common terminal of the current switch to at least one of the first reference current source and the second reference current source.

In accordance with a further embodiment, a method of testing a first plurality of driving circuits that are coupled to a plurality of individual contact pads includes coupling the plurality of driving circuits to a shared contact pad by closing a first plurality of test switches, wherein the plurality of test switches is coupled to the first plurality of driving circuits. The method further includes activating the first plurality of driving circuits to produce a test current, and measuring a current of the first plurality of driving circuits. Measuring the current of the first plurality of driving circuits may include measuring the current of the first plurality of driving circuits at the shared contact pad.

In an embodiment, the method may further include contacting the shared contact pad to a test fixture and/or contacting a ground pad, a supply voltage pad, and a communications interface to the test fixture. The test current of the first plurality of driving circuits may be lower than a current of the first plurality of driving circuits operating in a normal operation mode.

In an embodiment, the method may further include coupling a second plurality of driving circuits to the shared contact pad by closing a second plurality of test switches, activating the second plurality of driving circuits, and measuring a current of the second plurality of driving circuits. Activating the first plurality of driving circuits may include activating a plurality of current sources and/or a plurality of power switches.

In some embodiments, the method further includes activating a first driving circuit to produce a test current and measuring the test current of the first driving circuit at an individual contact pad. The method may also include determining if the measured current is within a predefined current range. In some examples, the method includes placing a wafer on an automated test equipment system.

In an embodiment, the method further includes activating a plurality of reference voltages, and comparing a signal of the plurality of driving circuits to the plurality of reference voltages. The method may also include connecting a first terminal of the first plurality of driving circuits to a first terminal of a comparator, connecting a reference current source to the first terminal of the comparator, and comparing a voltage of the first terminal of the comparator to a fixed voltage.

In accordance with a further embodiment, an integrated circuit includes a plurality of devices on the integrated circuit. Each device includes a driving circuit and a contact pad coupled to a first terminal of the driving circuit, and a switch having a first terminal coupled to the first terminal of the driving circuit. The integrated circuit further includes a current switch having a common terminal coupled to a second terminal of the switch, a first reference current source coupled to a first terminal of the current switch, a second reference current source coupled to a second terminal of the current switch, a comparator having a first input coupled to the common terminal of the current switch, and a controller coupled to the current switch. The controller may be configured to connect the common of the current switch to at least one of the first reference current source and the second reference current source. The driving circuit may include a current source and/or a power switch.

Advantages of embodiments include the ability to accurately test a large array of driving circuits. Some embodiments include the ability to test every driving circuit in a large array. Embodiments allow testing driving circuits before a load array (e.g. an LED array) is connected to the semiconductor device array, which can allow for the detection of defective driving circuits earlier in the production process, saving costs. Some embodiments allow for testing multiple driving circuits at once, leading to a short test time. Various embodiments allow for a tradeoff between the test time and the total number of added test components. Embodiments allow the driving circuits to operate at a reduced current in a test mode, minimizing the size of the added components.

A further advantage of some embodiments allow for the testing of a semiconductor array containing thousands of driving circuits with thousands of associated contact pads without requiring a probe card pads to be coupled to the corresponding contact pad of each driver to be tested.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
a plurality of devices, each device comprising:
   a driving circuit,
   an individual contact pad coupled to a first terminal of the driving circuit,
   a switch having a first terminal coupled to the first terminal of the driving circuit;
a shared contact pad coupled to a second terminal of the switch of the plurality of devices; and
a controller coupled to the switch of the plurality of devices, wherein the controller is configured to selectively control the switch to couple the driving circuit to the shared contact pad.

2. The integrated circuit of claim 1, wherein the controller is further configured to selectively activate the driving circuit in a normal operation mode and in a test mode, wherein an output current of the driving circuit is lower in the test mode than in the normal operation mode.

3. The integrated circuit of claim 2, wherein the output current in the test mode is less than one-tenth the output current in the normal operation mode.

4. The integrated circuit of claim 1, wherein:
the controller is further configured to operate in a normal operation mode and in a test mode;
the driving circuit is configured to output a current to the individual contact pad in the normal operation mode; and
the driving circuit is configured to open circuit the individual contact pad in the test mode.

5. The integrated circuit of claim 1, wherein the driving circuit comprises a current source.

6. The integrated circuit of claim 1, wherein the driving circuit comprises a power switch, and the integrated circuit further comprises a resistor coupled between the shared contact pad and the switch.

7. The integrated circuit of claim 1, wherein the individual contact pad is configured to be coupled to a corresponding LED during a normal operation mode.

8. The integrated circuit of claim 1, wherein the plurality of devices further comprises:
a comparator having a first terminal coupled to the first terminal of the driving circuit; and
a voltage reference coupled to a second input terminal of the comparator.

9. The integrated circuit of claim 1, further comprising:
a common terminal of a current switch coupled to the second terminal of the switch;
a first reference current source coupled to a first terminal of the current switch; and
a second reference current source coupled to a second terminal of the current switch.

10. The integrated circuit of claim 9, wherein the controller is further configured to connect the common terminal of the current switch to at least one of the first reference current source and the second reference current source.

11. A method of testing a first plurality of driving circuits that are coupled to a plurality of individual contact pads, the method comprising:
coupling the plurality of driving circuits to a shared contact pad by closing a first plurality of test switches, wherein the plurality of test switches is coupled to the first plurality of driving circuits;
activating the first plurality of driving circuits to produce a test current; and
measuring a current of the first plurality of driving circuits.

12. The method of claim 11, wherein measuring the current of the first plurality of driving circuits comprises measuring the current of the first plurality of driving circuits at the shared contact pad.

13. The method of claim 12, further comprising contacting the shared contact pad to a test fixture.

14. The method of claim 12, wherein the test current of the first plurality of driving circuits is lower than a current of the first plurality of driving circuits operating in a normal operation mode.

15. The method of claim 11, further comprising:
activating a first driving circuit to produce a test current; and
measuring the test current of the first driving circuit at an individual contact pad.

16. The method of claim 11, further comprising:
coupling a second plurality of driving circuits to the shared contact pad by closing a second plurality of test switches;
activating the second plurality of driving circuits; and
measuring a current of the second plurality of driving circuits.

17. The method of claim 11, further comprising determining if the measured current is within a predefined current range.

18. The method of claim 11, further comprising:
activating a plurality of reference voltages; and
comparing a signal of the plurality of driving circuits to the plurality of reference voltages.

19. The method of claim 11, further comprising:
connecting a first terminal of the first plurality of driving circuits to a first terminal of a comparator;
connecting a reference current source to the first terminal of the comparator; and
comparing a voltage of the first terminal of the comparator to a fixed voltage.

20. An integrated circuit comprising:
a plurality of devices on the integrated circuit, each device comprising:
a driving circuit,
a contact pad coupled to a first terminal of the driving circuit, and
a switch having a first terminal coupled to the first terminal of the driving circuit;
a current switch having a common terminal coupled to a second terminal of the switch;
a first reference current source coupled to a first terminal of the current switch;
a second reference current source coupled to a second terminal of the current switch;
a comparator having a first input coupled to the common terminal of the current switch; and
a controller coupled to the current switch, wherein the controller is configured to connect the common terminal of the current switch to at least one of the first reference current source and the second reference current source.

* * * * *